US011550227B2

(12) United States Patent
Mutsaers et al.

(10) Patent No.: US 11,550,227 B2
(45) Date of Patent: Jan. 10, 2023

(54) PROJECTION SYSTEM AND LITHOGRAPHIC APPARATUS COMPRISING SAID PROJECTION SYSTEM

(71) Applicant: ASML Netherlands B.V., Veldhoven (NL)

(72) Inventors: Marinus Engelbertus Cornelis Mutsaers, Rijen (NL); Robertus Johannes Marinus De Jongh, Boxmeer (NL); Jeroen Pieter Starreveld, Knegsel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/423,328

(22) PCT Filed: Dec. 13, 2019

(86) PCT No.: PCT/EP2019/085128
§ 371 (c)(1),
(2) Date: Jul. 15, 2021

(87) PCT Pub. No.: WO2020/148038
PCT Pub. Date: Jul. 23, 2020

(65) Prior Publication Data
US 2022/0082947 A1 Mar. 17, 2022

(30) Foreign Application Priority Data
Jan. 18, 2019 (EP) ...................... 19152497

(51) Int. Cl.
*G03F 7/20* (2006.01)
(52) U.S. Cl.
CPC ................ *G03F 7/70258* (2013.01)
(58) Field of Classification Search
CPC .............. G03F 7/70258; G03F 7/705
See application file for complete search history.

(56) References Cited

U.S. PATENT DOCUMENTS 6,549,270 B1   4/2003   Ota
9,164,401 B2 * 10/2015   Loopstra ............. G03F 7/70891
(Continued)

FOREIGN PATENT DOCUMENTS

JP   2005-175177 A   6/2005
JP   2009-223034 A   10/2009
(Continued)

OTHER PUBLICATIONS

International Search Report and Written Opinion of the International Searching Authority directed to related International Patent Application No. PCT/EP2019/085128, dated Feb. 25, 2020; 11 pages.

(Continued)

*Primary Examiner* — Hung V Nguyen
(74) *Attorney, Agent, or Firm* — Sterne, Kessler, Goldstein & Fox P.L.L.C.

(57) ABSTRACT

Disclosed is a projection system for a lithographic apparatus, comprising: a plurality of optical elements configured to direct a beam along a path, and a control system configured to receive an input signal indicative of a deformation of a first optical element of the plurality of optical elements. The plurality of optical elements may be configured to position the beam onto an object arranged on an object support, and a pattern may be imparted on the beam by a patterning device arranged on support structure. The control system is configured to generate an output signal for controlling a position of at least a second optical element of the plurality of optical elements, based on said input signal; and/or an output signal for controlling a position of said object support, based on said input signal; and/or an output signal for controlling a position of said support structure, based on said input signal.

19 Claims, 3 Drawing Sheets

(56) References Cited

U.S. PATENT DOCUMENTS

| | | |
|---|---|---|
| 9,678,440 B2 | 6/2017 | Juergens |
| 10,082,740 B2 | 9/2018 | Chen et al. |
| 10,599,047 B2 | 3/2020 | Ravensbergen et al. |
| 10,976,675 B2 | 4/2021 | Butler et al. |
| 11,150,560 B2 | 10/2021 | Van De Kerkhof et al. |
| 2005/0274897 A1 | 12/2005 | Singer et al. |
| 2009/0115988 A1 | 5/2009 | Takeshita |
| 2011/0063598 A1 | 3/2011 | Fiolka et al. |
| 2017/0363965 A1* | 12/2017 | Butler .................. G03F 7/705 |

FOREIGN PATENT DOCUMENTS

| | | |
|---|---|---|
| JP | 2010-187002 A | 8/2010 |
| JP | 2016-509691 A | 3/2016 |
| TW | I591454 B | 7/2017 |
| TW | 2018-00875 A | 1/2018 |
| TW | 2019-03352 A | 1/2019 |
| WO | WO 2008/023071 A1 | 2/2008 |
| WO | WO 2018/141520 A1 | 8/2018 |

OTHER PUBLICATIONS

International Preliminary Report on Patentability directed to related International Patent Application No. PCT/EP2019/085128, dated Jun. 16, 2021; 9 pages.

Lin et al., "High Power LPP EUV course system development status," Proceedings of SPIE, vol. 7520, Lithography Asia, Dec. 2009; pp. 1-10.

* cited by examiner

PROJECTION SYSTEM AND LITHOGRAPHIC APPARATUS COMPRISING SAID PROJECTION SYSTEM

CROSS-REFERENCE TO RELATED APPLICATION

The application claims priority of EP application 19152497.4 which was filed on Jan. 18, 2019 which is incorporated herein in its entirely by reference.

FIELD

The present invention relates to a projection system for a lithographic apparatus, a lithographic apparatus comprising said projection system, and a method for controlling a projection system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \tag{1}$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Possible sources include laser-produced plasma (LPP) sources, although other types of source are possible.

An example of current progress in the development of LPP sources for EUV lithography is described in the paper "High power LPP EUV source system development status" by Benjamin Szu-Min Lin, David Brandt, Nigel Farrar, SPIE Proceedings Vol. 7520, Lithography Asia 2009, December 2009 (SPIE Digital Library reference DOI: 10.1117/12.839488). In a lithographic apparatus, the source apparatus will typically be contained within its own vacuum housing, while a small exit aperture is provided to couple the EUV radiation beam into an optical system where the radiation is to be used.

In order to be useful in high-resolution patterning for lithography, the EUV radiation beam must be conditioned to obtain desired parameters such as uniformity of intensity and angular distribution, when it reaches the reticle. Examples of an illumination system are described in United States Patent Application Publication Nos. US 2005/0274897A1 (Carl Zeiss/ASML) and US 2011/0063598A (Carl Zeiss). The example systems include a 'fly's eye' illuminator which transforms the highly non-uniform intensity profile of the EUV source into a more uniform and controllable source.

For good imaging performance, it is important that the EUV radiation beam is positioned accurately onto the substrate. To achieve this, the lithographical apparatus may comprise a projection system comprising a plurality of optical elements, e.g. mirrors, and a drive system for controlling a position of one or more of said optical elements.

SUMMARY

Aspects of embodiments of the present invention aim to provide an improved or at least alternative projection system for a lithographic apparatus and a method for controlling a projection system.

In an embodiment the invention relates to a projection system for a lithographic apparatus, comprising: a plurality of optical elements configured to direct a beam along a path; and a control system configured to receive an input signal indicative of a deformation of at least a first optical element of the plurality of optical elements, and generate an output signal for controlling a position of at least a second optical element of the plurality of optical elements, based on said input signal.

In an embodiment the invention relates to a projection system for a lithographic apparatus, comprising: a plurality of optical elements configured to direct a beam along a path, wherein the plurality of optical elements is configured to position the beam onto an object which is arranged on an object support; and a control system configured to receive an input signal indicative of a deformation of at least a first optical element of the plurality of optical elements, and generate an output signal for controlling a position of said object support, based on said input signal.

In an embodiment the invention relates to a projection system for a lithographic apparatus, comprising: a plurality of optical elements configured to direct a beam along a path, wherein the beam is configured to, before the plurality of optical elements receive the beam, have a pattern imparted by a patterning device supported by a support structure; a control system configured to receive an input signal indicative of a deformation of at least a first optical element of the plurality of optical elements, and generate an output signal for controlling a position of said support structure, based on said input signal.

In an embodiment the invention relates to a lithographic apparatus comprising: a substrate support configured to hold a substrate; a radiation source configured to generate a beam; a support structure configured to support a patterning device configured to impart a pattern to the beam; and a projection system according to one or more embodiments of the invention configured to position the beam onto the substrate.

In an embodiment the invention relates to a method for controlling a projection system comprising a plurality of optical elements configured to direct a beam along a path, the method comprising the following steps: determining an input signal indicative of a deformation of at least a first optical element of the plurality of optical elements; and controlling a position of at least a second optical element of the plurality of optical elements, based on said input signal.

In an embodiment the invention relates to a method for controlling a projection system comprising a plurality of optical elements configured to direct a beam along a path onto an object, the method comprising the following steps: determining an input signal indicative of a deformation of at least a first optical element of the plurality of optical elements; and controlling a position of the object, based on said input signal.

In an embodiment the invention relates to a method for controlling a projection system comprising a plurality of optical elements configured to direct a beam along a path onto an object, the method comprising the following steps: determining an input signal indicative of a deformation of at least a first optical element of the plurality of optical elements; controlling a position of the object, based on said input signal.

These aspects of the invention and various optional features and implementations thereof will be understood by the skilled reader from the description of examples which follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
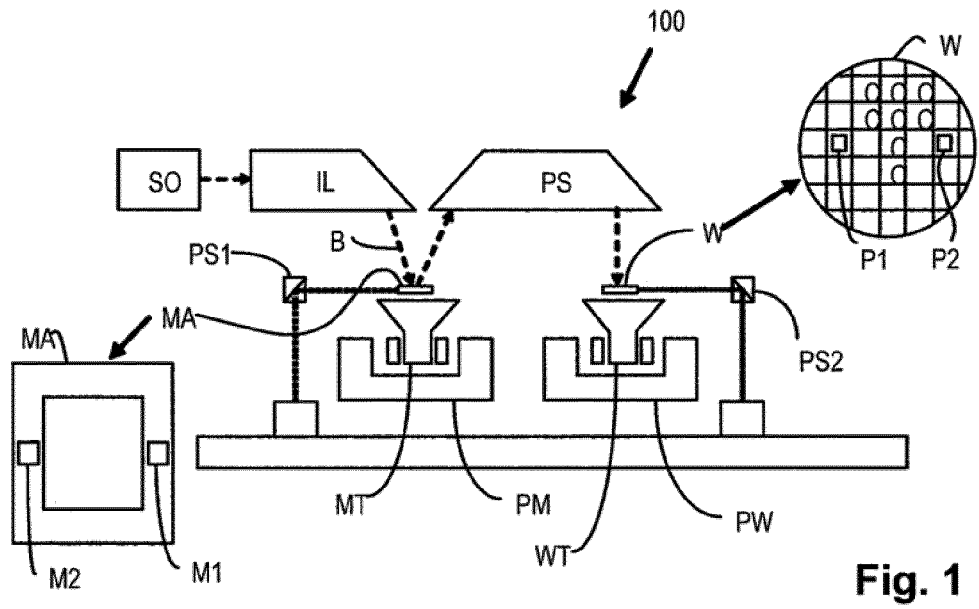
FIG. 1 depicts schematically a lithographic system according to an embodiment of the invention.

FIG. 1 schematically depicts a lithographic system 100 according to an embodiment of the present invention, the lithographic system comprising a lithographic apparatus and an EUV radiation source configured for generating EUV radiation, e.g. an EUV radiation beam. In the embodiment as shown, the EUV radiation source comprises a source collector module SO. In the embodiment as shown, the lithographic scanning apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps. The projection system PS may be a projection system PS according to the invention.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO of the EUV radiation source. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the EUV radiation source may be separate entities, for example when a $CO_2$ laser is used to provide the laser beam for fuel excitation.

In such cases, the laser is not considered to form part of the lithographic system and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The embodiments to be illustrated involve scanning, as in the modes 2 and 3 just mentioned.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Figure 2:
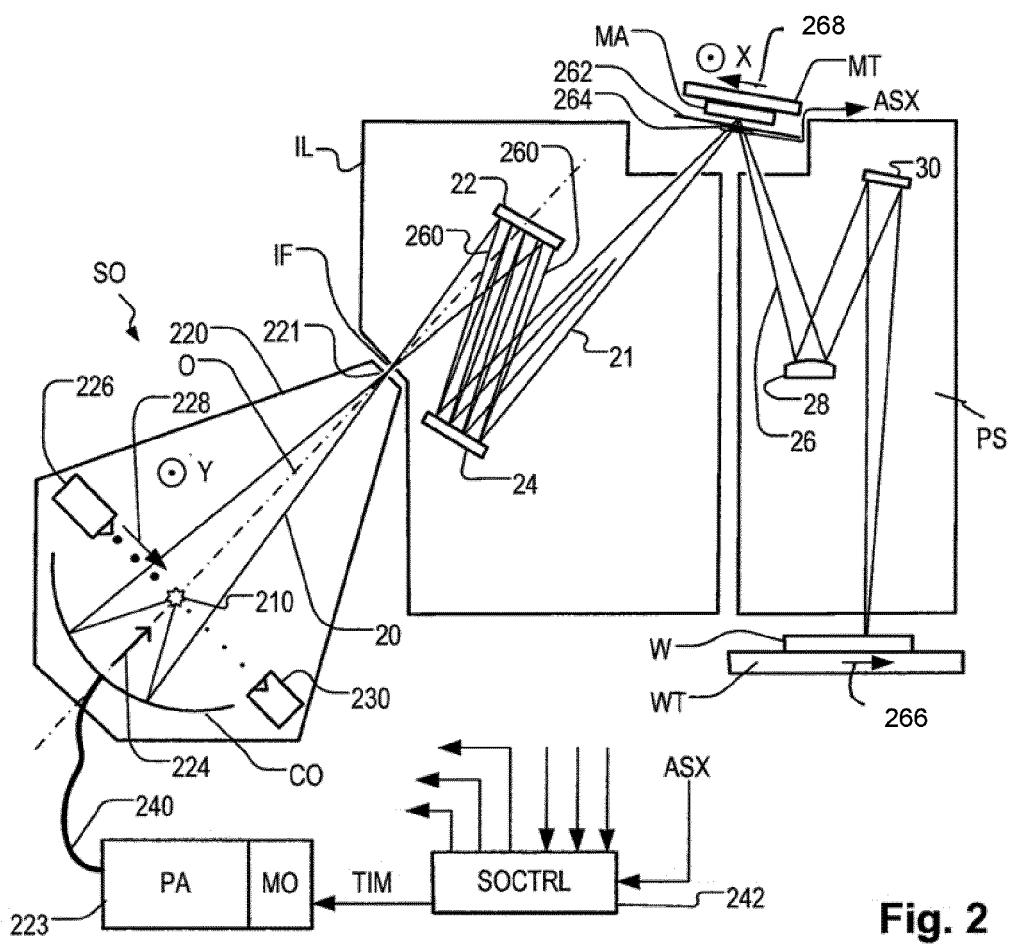
FIG. 2 is a more detailed view of the apparatus of FIG. 1 and shows a novel monitoring and control system for an EUV radiation source.

FIG. 2 shows the system 100 in more detail, including the EUV radiation source comprising the source collector module SO and the lithographic scanning apparatus comprising the illumination system IL, and the projection system PS. The source collector module SO of the EUV radiation source is constructed and arranged such that a vacuum environment can be maintained in an enclosing structure 220 of the source collector module SO. The systems IL and PS are likewise contained within vacuum environments of their own. An EUV radiation emitting plasma 210 may be formed by a laser produced LPP plasma source. The function of source collector module SO is to deliver EUV radiation beam 20 from the plasma 210 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 210.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2. The United States patent application publications referred to above show three additional elements in the illumination system, for example.

Considering source collector module SO in more detail, laser energy source comprising laser 223 is arranged to deposit laser energy 224 into a fuel, such as xenon (Xe), tin (Sn) or lithium (Li), creating the highly ionized plasma 210 with electron temperatures of several 10's of eV. Higher energy EUV radiation may be generated with other fuel materials, for example Tb and Gd. The energetic radiation generated during de-excitation and recombination of these ions is emitted from the plasma, collected by a near-normal incidence collector CO and focused on the aperture 221. The plasma 210 and the aperture 221 are located at first and second focal points of collector or collector mirror CO, respectively.

To deliver the fuel, which for example is liquid tin, a droplet generator 226 is arranged within the enclosure 220, arranged to fire a high frequency stream 228 of droplets towards the desired location of plasma 210. In operation, laser energy 224 is delivered in a synchronism with the operation of droplet generator 226, to deliver impulses of radiation to turn each fuel droplet into a plasma 210. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 210. A trap 230 is provided on the opposite side of the enclosing structure 220, to capture fuel that is not, for whatever reason, turned into plasma.

Numerous additional components in the source collector module and the lithographic apparatus are present in a typical apparatus, though not illustrated here. These include arrangements for reducing or mitigating the effects of contamination within the enclosed vacuum, for example to prevent deposits of fuel material damaging or impairing the performance of collector or collector mirror CO and other optics. Also, one or more spectral purity filters will be included in the source collector module SO and/or illumination system IL. These filters are for eliminating as much as possible radiation of unwanted wavelengths, that are generated by the laser and/or the plasma 210, in addition to the wanted wavelengths of the UV radiation. The spectral purity filter(s) may be positioned near the virtual source point or at any point between the collector and the virtual source point. The filter can be placed at other locations in the radiation path, for example downstream of the virtual source point IF. Multiple filters can be deployed. The skilled person is familiar with the need for these measures, and the manner in which they may be implemented, and further detail is not required for the purposes of the present disclosure.

Referring to laser 223 from FIG. 2 in more detail, the laser in the presented embodiment is of the MOPA (Master Oscillator Power Amplifier) type. This consists of a "master" laser or "seed" laser, labeled MO in the diagram, followed by a power amplifier (PA). A beam delivery system 240 is provided to deliver the laser energy 224 into the module SO. In practice, the pre-pulse element of the laser energy will be delivered by a separate laser, not shown separately in the diagram. Laser 223, fuel source (i.e. the droplet generator) 226 and other components may e.g. be controlled by a source control module 242.

As one of ordinary skill in the art will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream (228, described below), while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Referring in a little more detail to the illumination system, faceted field mirror device 22 comprises an array of individual facets, so that the EUV radiation beam 20 is divided into a number of sub beams, of which one is labeled 260 in the diagram. Each sub beam is directed towards an individual facet on the faceted pupil mirror device 24. The facets of pupil mirror device 24 are arranged to direct their individual sub beams onto a target which is a slit-shaped area of patterning device MA. The division into sub beams 260 and the combination into a single beam 21 is designed to create highly uniform illumination over the slit area, when the illumination arriving from the source collector module is highly non-uniform in its angular distribution. As is also known, the facets of the devices 22 and/or 24 may be steerable and/or maskable, in order to implement different illumination modes.

The conditioned EUV radiation beam 21 is delivered to patterning device MA through a conditioning and masking module 262. This module includes a masking unit, also referred to as the reticle mask (REMA) which may have movable blades defining the extent of an illumination slit in X and Y directions. Typically, the illumination slit as applied in EUV-type lithographic apparatuses may be curved.

In front of the REMA may also be an illumination uniformity correction module (UNICOM).

To expose a target portion C on substrate W, pulses of radiation are generated on substrate table WT and masked table MT perform synchronized movements 266, 268 to scan the pattern on patterning device MA through the slit of illumination.

Examples of illumination systems including REMA and UNICOM functions are described in United States Patent Application Publication Nos. 2005/0274897A1 and 2011/0063598A.

Many measures are applied in the source controller 242. Such measures include monitoring to ensure that the virtual source point IF is aligned with the aperture 221, at the exit from the source collector module SO. In systems based on LPP sources, control of alignment is generally achieved by controlling the location of the plasma 210, rather than by moving the collector optic CO. The collector optics, the exit aperture 221 and the illuminator IL are aligned accurately during a set-up process, so that aperture 221 is located at the second focal point of collector optic. However, the exact location of the virtual source point IF formed by the EUV radiation at the exit of the source optics is dependent on the exact location of the plasma 210, relative to the first focal point of the collector optics. To fix this location accurately enough to maintain sufficient alignment generally requires active monitoring and control.

For this purpose, source control module (controller) 242 in this example controls the location of the plasma 210 (the source of the EUV radiation), by controlling the injection of the fuel, and also for example the timing of energizing pulses from laser. In a typical example, energizing pulses of laser radiation 224 are delivered at a rate of 50 kHz (period 20 µs), and in bursts lasting anything from, say, 20 ms to 20 seconds. The duration of each main laser pulse may be around 1 µs, while the resulting EUV radiation pulse may last around 2 µs. By appropriate control, it is maintained that the EUV radiation beam is focused by collector CO precisely on the aperture 221. If this is not achieved, all or part of the beam will impinge upon surrounding material of the enclosing structure.

The source control module 242 is supplied with monitoring data from one or more arrays of sensors (not shown) which provide a first feedback path for information as to the location of the plasma. The sensors may be of various types, for example as described in Unites States Patent Application Publication No. 2005/0274897A1, mentioned above. The sensors may be located at more than one position along the radiation beam path. They may for example be located around and/or behind the field mirror device 22, purely for the sake of example. The sensor signals just described can be used for control of the optical systems of the illuminator IL and projection system PS. They can also be used, via feedback path, to assist the control module 242 of the source collector module SO to adjust the intensity and position of the EUV plasma source 210. The sensor signals can be processed for example to determine the observed location of the virtual source IF, and this is extrapolated to determine, indirectly, the location of the EUV source. If the virtual source location drifts, as indicated by the sensor signals, corrections are applied by control module 242 to re-center the beam in the aperture 221.

Rather than rely entirely on the signals from the illuminator sensors, additional sensors and feedback paths may generally be provided in the source collector module SO itself, to provide for more rapid, direct and/or self-contained control of the radiation source. Such sensors may include one or more cameras, for example, monitoring the location of the plasma. In this way the location beam 20 is maintained in the aperture 221, and damage to the equipment is avoided, and efficient use of the radiation is maintained.

To achieve an accurate positioning of the EUV radiation beam onto the substrate W, the projection system PS may be embodied according to the invention as will be explained herein.

Figure 3:
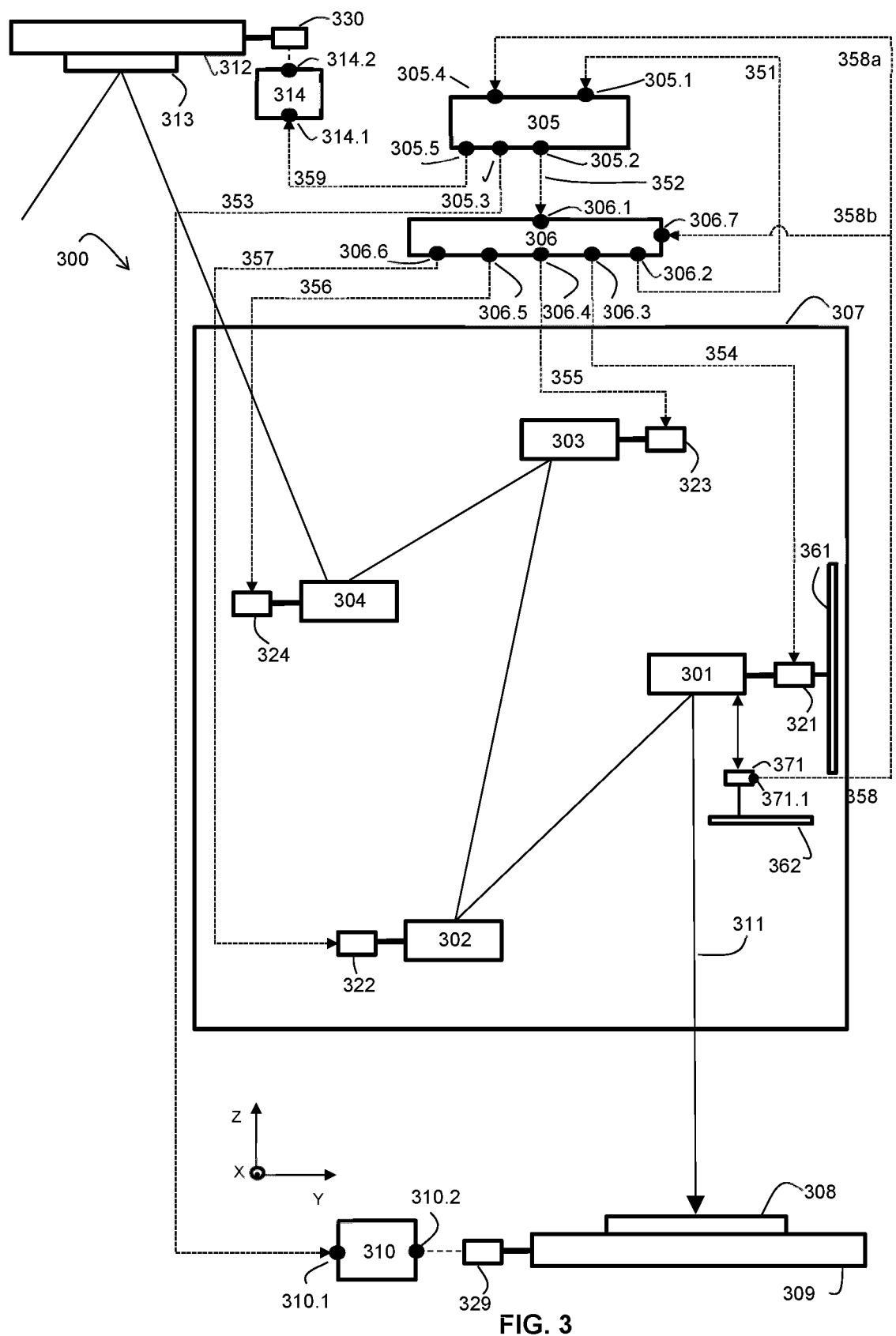
FIG. 3 schematically shows an embodiment of a projection system according to the invention.

The invention relates to a projection system 300 for a lithographic apparatus. An embodiment of such a projection system 300 is schematically shown in FIG. 3. The projection system 300 comprises a plurality of optical elements 301, 302, 303, 304 configured to direct a beam 311 along a path, and a control system 305. The control system 305 is configured to receive an input signal 351 indicative of a deformation of at least a first optical element 301 of the plurality of optical elements 301, 302, 303, 304. The control system 305 is further configured to generate an output signal 352 for controlling a position of at least a second optical element 302 of the plurality of optical elements 301, 302, 303, 304, based on said input signal 351.

In an embodiment, the control system 305 may thus be configured to receive an input signal 351 indicative of a deformation of one optical element of the plurality of optical elements 301, 302, 303, 304 and may be configured to generate an output signal 352 for controlling a position of at least a second optical element 302 of the plurality of optical elements 301, 302, 303, 304, based on said input signal 351. In such embodiment, the control system 305 may optionally also be configured to generate an output signal for controlling a position of the one optical element. In such embodiment, the deformation of the one optical element may cause an error in the accuracy with which the beam 311 is positioned onto the object 308. By controlling the position of the at least a second optical element 302, the path of the beam 311 can be adapted, and said error can be at least partly mitigated. In an embodiment, the control system 305 may be configured to receive an input signal indicative of a deformation of two or more optical elements of the plurality of optical elements 301, 302, 303, 304 and may be configured to generate an output signal for controlling a position of at least one other optical element of the plurality of optical elements 301, 302, 303, 304, based on said input signal. In such embodiment, the control system 305 may optionally also be configured to generate an output signal for controlling a position of the two or more optical elements. The deformation of the two or more optical elements may cause an error in the accuracy with which the beam 311 is positioned onto the object 308. By controlling the position of at least one other optical element 302, the path of the beam 311 can be adapted, and said error can be at least partly mitigated.

In the shown example a pattern is imparted to the beam 311, which may e.g. comprise EUV radiation, by a patterning device 313, which may e.g. be a reticle or a mask. The beam 311 then enters a housing 307, in which optionally a vacuum or near-vacuum environment is provided. The beam 311 is directed from a fourth optical element 304 to third optical element 303, and subsequently to second optical element 302 and first optical element 301. The optical elements 301, 302, 303, 304 may e.g. be mirrors and/or lenses. Finally, the beam 311 is directed from the first optical element 301 onto an object 308, which may e.g. be a substrate or wafer. Although the projection system 300 in the shown example comprises four optical elements 301, 302, 303, 304, in practice any number of suitable optical elements may be provided, e.g. two, three, four, five, six, seven, eight, nine, or ten. In an embodiment, one or more of the optical elements of the projection system may consist of or comprise multiple discrete optical elements. As an example, an optical element as applied in the projection system according to the invention may be a mirror which consists of a plurality of smaller mirrors. Such a mirror may e.g. be referred to as a facetted mirror. In a similar manner, an optical element as applied in a projection system according to the present invention may consist of or comprise a plurality of lenses. It is noted that the optical elements 301, 302, 303, 304 are shown schematically in FIG. 3 and may in practice be rotated and/or comprise curved surfaces to direct the beam 311 in the appropriate direction.

In order to achieve an accurate lithographic process, e.g. an accurate projection of a pattern on a particular location on the object 308, an accurate positioning of the beam 311 is required. The positioning of the beam 311 on the object 308 is affected, amongst others, by shape and position of the optical elements 301, 302, 303, 304. In particular, the inventors have found that deformations of said optical elements 301, 302, 303, 304 can have a substantial effect on the projected pattern. For example, in a lithographic process during exposure, inaccuracies causing the beam 311 to deviate in the XY plane may result in overlay errors. The distance travelled by the beam 311 may also be affected by the deformations, resulting in deviations in the Z direction. This may e.g. result in the beam 311 being out of focus when the beam 311 arrives at the object 308.

Changes in the shape of the optical element 301 may also cause aberrations. Types of aberrations that become more dominant due to deformations of e.g. the optical elements 301, 302, 303, 304 of the projection system 300 are e.g. distortion, astigmatism, and coma. Such aberration may result in so-called higher order imaging errors. The denotation higher order is derived from describing the beam 311 in a mathematical way using Zernike polynomials. Overlay and focus are described using the first order Zernike polynomials, while e.g. distortion, astigmatism, and coma are described using higher order polynomials.

The above-mentioned errors may, with the ever increasing demands in e.g. the semiconductor industry, become significant for a state of the art lithographic apparatus.

Deformation of an optical element 301, 302, 303, 304 can e.g. occur from forces exerted on said optical element 301, 302, 303, 304. Said forces may e.g. originate from positioning said optical element 301, 302, 303, 304 and/or from external sources causing e.g. vibrations. Also environmental factors such as the temperature and pressure can cause deformations of the optical elements 301, 302, 303, 304. For example, variations in pressure may result in a variation of forces exerted on the optical element 301, 302, 303, 304 which may cause deformations. It would be desirable to at least mitigate the effects of a deformation of an optical element of a projection system.

The invention provides a solution by providing the input signal 351 to the control system 305. The input signal 351 is indicative of the deformation of the first optical element 301. In this context indicative means the input signal 351 comprises information from which the deformation of the first optical element 301 can at least partly be determined. For example, the input signal 351 may comprise information relating to one or more factors contributing to said deformation. For example, the input signal 351 may comprise information relating to forces exerted on the first optical element301. For example, the input signal 351 may comprise information relating to vibrations to which the first optical element 301 is exposed. For example, the input signal 351 may comprise information relating to environmental factors such as temperature and/or pressure.

Based on the received input signal 351, an output signal 352 is generated by the control system 305 for controlling the position of the second optical element 302. The position of the second optical element 302 is thus controlled taking into account the deformation of the first optical element 301. The accuracy of the positioning of the beam 311 on the object 308 can as such be improved. For example, the deformation of the first optical element 301 may cause an error in the accuracy with which the beam 311 is positioned onto the object 308. By controlling the position of the second optical element 302 the path of the beam 311 can be adapted, and said error can be at least partly mitigated.

FIG. 3 illustrates that in an optional embodiment, the control system 305 is configured to generate one or more output signals 352 for controlling a position of multiple of the plurality of optical elements 302, 303, 304 other than the first optical element 301, based on said input signal. In the shown example this is comprised in a single output signal 352 which is received by a drive system 306. The drive system 306 will be elaborated on further below. However, it is also possible that multiple output signals 352 are generated, e.g. received by respective multiple drive systems 306. For example, the second optical element 302 and a third optical element 303 may be controlled based on the output signal 352. The accuracy of positioning the beam 311 on the object 308 can as such be further increased.

In this embodiment it is possible to adjust the positions of each of the multiple optical elements 302, 303. This gives more options to mitigate the deformation of the first optical element 301. It may therefore be possible to adjust the position of each of said multiple optical elements 302, 303 by a relatively small distance. In particular, said distances may be smaller than a distance by which a position of the second optical element 302 should be adjusted in an embodiment wherein only the position of the second optical element would be controlled based on the input signal 351. The forces exerted on the optical elements 302, 303 may therefore also be smaller, and consequently also deformations of said optical elements 302, 303 may be smaller. Possible inaccuracies in the positioning of the beam 311 caused by deformations 302, 303 of said optical elements 302, 303 may therefore also be smaller.

This embodiment wherein the positions of multiple optical elements 302, 303 are controlled, may also be advantageous to mitigate higher order imaging errors which may result from the deformation of the first optical element 301. In addition to adjusting the direction of the beam 311, also aberrations of the beam 311 can be adjusted by controlling the positions of multiple optical elements 302, 303. As such the quality of the beam 311, and e.g. a pattern imparted on the beam 311, as projected on the object 308 can be improved.

In an optional embodiment as shown in FIG. 3, the control system 305 is configured to generate one or more output signals 352 for controlling a position of each of the plurality of optical elements 302, 303, 304 other than the first optical element 301, based on said input signal. The accuracy of positioning of the beam 311 on the object 308 can as such be further increased and higher order imaging errors can be further mitigated.

In the shown example, the projection system 300 comprises an optional drive system 306 configured to control a position of the first optical element 301. In the shown example, the input signal 351 can e.g. represent forces exerted on the first optical element 301 and controlled by the drive system 306. Said forces can be indicative of the deformation of the first optical element 301, because said forces may cause at least a part of said deformation. As such, the input signal 351 representing the exerted forces can be considered to represent the deformation and can be used as input to at least partly mitigate the deformation. In the shown example the drive system 306 receives the output signal 352 from the control system 305 via output terminal 305.2 and input terminal 306.1.

Optionally the drive system 306 is configured to control said forces to be exerted on the first optical element 301 to at least partially compensate for a difference between a position of the first optical element 301 and a desired position. For example, a position of the first optical element 301 may be measured, and a feedback loop may be provided such that said measurement can be compared to a desired position of the first optical element 301. The difference between the position of the first optical element 301 and the desired position may e.g. be caused by vibrations. Such vibrations may e.g. caused by external factors and may e.g. transmitted or excited via a floor and/or a base frame. In an embodiment the projection system 300 may be used in a "multiple stage" lithographic apparatus having two (dual stage) or more substrate tables (and/or two or more mask tables). The additional tables or stages may be used in parallel, or on which preparatory steps are carried while one or more other tables or stages are being used for exposure. These additional tables or stages, and/or the preparatory steps carried out thereon, may cause vibrations which affect the position of the first optical element 301.

In these embodiments the forces exerted on the first optical element 301 are thus based on the feedback information which represents the actual situation. Said actual situation may change at a high frequency. Said forces are not known a priori and may also be referred to as feedback forces. By taking into account the feedback forces, the actual deformation of the first optical element 301 is taken into account and the accuracy of positioning the beam 311 on the object 308 can be improved.

In the shown example the drive system 306 controls a first actuator 321 for controlling the position of the first optical element 301. Within the meaning of the present invention, an actuator may refer to a single actuator or an arrangement or set of multiple actuators. Such an arrangement or set of actuators may e.g. be configured to control a position of an optical element in multiple degrees of freedom. As an example, such a set of actuators may e.g. be configured to control a position of an optical element in 6 degrees of freedom (DOF), i.e. translations in X, Y, Z and rotations Rx, Ry, Rz. The first actuator 321 receives a control signal 354 from an output terminal 306.3. The forces exerted by the first actuator 321 onto the first optical element 301 are transmitted from the drive system 306 to the control system 305 as input signal 351 via output terminal 306.2 and input terminal 305.1.

In the shown example the drive system 306 also controls a second actuator 322 for controlling a position of the second optical element 302. The second actuator 322 receives a control signal 357 via output terminal 306.6. In the shown example the drive system 306 also controls a third actuator 323 for controlling a position of the third optical element 303. The third actuator 323 receives a control signal 355 via output terminal 306.4. In the shown example the drive system 306 also controls a fourth actuator 324 for controlling a position of the fourth optical element 304. The fourth actuator receives a control signal 356 via output terminal 306.5. However, it is also possible that another drive system is provided for controlling the position of the optical elements 302, 303, 304 other than the first optical element 301. It is also possible that the position of one or more of said optical elements 302, 303, 304 is not controlled.

For each of the optical elements 301, 302, 303, 304, a controller bandwidth may optionally be defined. The controller bandwidth of an optical element 301, 302, 303, 304 represents a frequency range in which said optical elements 301, 302, 303, 304 are configured to be controlled. The controller bandwidth may e.g. be limited to avoid that the optical element 301, 302, 303, 304 is driven too close to a resonance frequency. The controller bandwidth may e.g. be implemented in the drive system 306, e.g. on a level of electronics and/or software. The controller bandwidths of two or more of the optical elements 301, 302, 303, 304 may be different from each other.

The output signal 352 may comprise information based on which the position of the second optical element 302 can be controlled. For example, in the shown embodiment said information may represent a desired position of the second optical element 302. For example, in the shown embodiment said information may represent a desired correction of the position of the second optical element 302. Thus, in the shown example a desired position or desired correction is determined by the control system 305, which is transmitted to the drive system 306 as part of output signal 352. Output signal 352 may comprise more information, e.g. desired positions or desired corrections of positions of one or more of the other optical elements 301, 302, 303, 304. The drive system 306 may comprise computational functionality to transform the information comprised by output signal 352 into control signals 354, 355, 356, 357 for the actuators 321, 322, 323, 324.

However, many other implementation are possible within the scope of the invention. For example, separate drive systems may be provided for one or more of the optical elements 301, 302, 303, 304, e.g. wherein the control system 305 generates separate output signals which are input signals for each of those drive systems. For example, the control system 305 and the drive system 306 may be combined in a single component, wherein optionally the output signal 352 and input signal 351 represent internal signals in said component. For example, the output signal 352 may comprise information which comprises a desired force to be exerted on the second optical element 302. For example, the output signal 352 may comprise and/or be a control signal for controlling one or more of the actuators 321, 322, 323, 324. For example, the control system 305 may determine the deformation of the first optical element 301, optionally in an intermediate step.

In the embodiment shown in FIG. 3 the plurality of optical elements 301, 302, 303, 304 are configured to position the beam 311 onto the object 308. The object 308 is arranged on an object support 309. The control system 305 is optionally further configured to generate an output signal 353 for controlling a position of said object support 309, based on said input signal 351. In this embodiment, the position of the object support 309 can be controlled as well as the position of one or more of the optical elements 302, 303, 304. The accuracy with which the beam 311 is positioned onto the object 308 can as such be increased, which may in particular be beneficial for overlay and focus. This embodiment may in particular be advantageous as the object support 309 may already be configured to move at high speeds during the exposure during the lithographic process. The position of the object support 309 may e.g. be controlled by an object support drive system 310. The object support drive system 310 optionally controls an optional object support actuator 329 and as such the object support 309. The object support 309 may be controlled by the object support drive system 310 with a particular controller bandwidth. The controller bandwidth as applied may be defined similar to the controller bandwidth for the optical elements 301, 302, 303, 304. The controller bandwidth of the object support 309 may represent a frequency range in which the object support 309 is configured to be controlled. The controller bandwidth may e.g. be limited to avoid that the object support 309 is driven too close to a resonance frequency. The controller bandwidth may e.g. be implemented in the object support drive system 310, e.g. on a level of electronics and/or software. The object support 309 may e.g. be controlled with a relatively high controller bandwidth, e.g. compared to optical elements 301, 302, 303, 304. This may be caused by the object support having a higher resonance frequency than the optical elements. This allows to mitigate deformations of the first optical element 301 more accurate and faster.

However, it is also envisaged that accuracy with which the beam 311 is positioned onto the object 308 can be increased by controlling the position of the object support 309 without controlling the positions of the optical elements 301, 302, 303, 304. This may be advantageous as the position of the object support 309 may be controllable with a relatively high controller bandwidth. The invention therefore also relates to a projection system 300 for a lithographic apparatus, comprising a plurality of optical elements 301, 302, 303, 304 configured to direct a beam 311 along a path. The plurality of optical elements 301, 302, 303, 304 are configured to position the beam 311 onto an object 308, wherein the object 308 is arranged on an object support 309. The projection system 300 further comprises a control system 305 configured to receive an input signal 351 indicative of a deformation of at least a first optical element 301 of the plurality of optical elements 301, 302, 303, 304. The control system 305 is further configured to generate an output signal 353 for controlling a position of said object support 309, based on said input signal 351.

In the shown example the projection system 300 comprises an optional object support drive system 310. The object support drive system 310 is configured to control a position of the object support 309, and receives the output signal 353 via output terminal 305.3 of the control system 305 and input terminal 310.1 of the object support drive system 310. In the shown embodiment the object support drive system 310 controls an optional object support actuator 329 connected to an output terminal 310.2. In some embodiments it is possible that the object support drive system 310 and the drive system 306 are incorporated as a single drive system. The object support actuator 329 may be able to control the position of the object support 309 in the X, Y and/or Z direction and to control a rotation of the object support 309 in the Rx, Ry and/or Rz direction.

In the shown example, the beam 311 is configured to, before the plurality of optical elements 301, 302, 303, 304 receive the beam 311, have a pattern imparted by a patterning device 313. The patterning device 313 is supported by a support structure 312. In an embodiment, the control system 305 is further configured to generate an output signal 359 for controlling a position of said support structure 312, based on said input signal 351. As such the accuracy of projecting the pattern onto the object 308 can be improved, which is in particular advantageous for overlay and focus. For example, the position of the support structure 312 can be controlled by a support structure drive system 314. The support structure drive system 314 receives the output signal 359 via output terminal 305.5 and input terminal 314.1. The support structure drive system 314 comprises an output terminal 314.2 for controlling a support structure actuator 330 for controlling the position of the support structure 312. A controller bandwidth can be defined for the support structure 312 similarly as for the optical elements 301, 302, 303, 304 and object support 309 above.

However, it is also envisaged that the accuracy of the projection of the beam 311 and pattern onto the object 308 can be increased by controlling the position of the support structure 312 without controlling the positions of the optical elements 301, 302, 303, 304, and/or the object support 309. The invention therefore also relates to a projection system 300 for a lithographic apparatus, comprising a plurality of optical elements 301, 302, 303, 304. The plurality of optical elements 301, 302, 303, 304 are configured to direct a beam 311 along a path. The beam 311 is configured to, before the plurality of optical elements 301, 302, 303, 304 receive the beam 311, have a pattern imparted by a patterning device 313. The patterning device 313 is supported by a support structure 312. The projection system 300 further comprises a control system 305 configured to receive an input signal 351 indicative of a deformation of at least a first optical element 301 of the plurality of optical elements 301, 302, 303, 304. The control system 305 is further configured to generate an output signal 359 for controlling a position of said support structure 312, based on said input signal 351.

In some embodiments it is possible that the object support drive system 310 and/or the drive system 306 and/or the support structure drive system 314 are incorporated as a single drive system.

In the shown embodiment the control system 305 determines a desired position or a desired correction of a position of the object support 309 and/or the support structure 312. Output signals 353 and output signal 359, respectively, comprises information relating to said desired position or desired correction. Based on said information the object support drive system 310 and support structure drive system 314, respectively, generate a control signal for controlling object support actuator 329 and support structure actuator 330, respectively. However, other arrangements are possible, similarly as explained above with respect to the drive system 306. For example, output signal 353 and/or output signal 359, may comprise information relating to desired forces to be exerted on the object support 309 and the support structure 312, respectively. For example, output signal 353 and/or output signal 359, may comprise and/or be control signals for object support actuator 329 and support structure actuator 330, respectively.

The actuators 321, 322, 323, 324, 329, 330 may in an embodiment be piezoelectric, mechanical, electrical, electromagnetic and/or magnetic actuators.

In the shown example the first optical element 301 is the optical element which is arranged last of the plurality of optical elements 301, 302, 303, 304 in the path of the beam 311. This may e.g. be advantageous when the controller bandwidth of the first optical element 301 is relatively small. This may e.g. be the case when this is a relatively big and/or heavy optical element 301 and/or when the optical element 301 has relatively low resonance frequencies. This may e.g. be the case because the optical element arranged last in the path of the beam 311 should be able to direct the beam 311 over a relatively large range of angles. The controller bandwidth of the second optical element 302, third optical element 303 and/or fourth optical element 304, and/or the object support 309, and/or the support structure 312 may e.g. be higher. In that case the first actuator 321 may not be able to react fast enough to mitigate deformations of the first optical element 301. Advantageously said deformations can be mitigated by controlling the position of one or more of the other optical elements 302, 303, 304, and/or the object support 309, and/or the support structure 312. Of course, in other embodiments the first optical element may be an optical element other than the last of the plurality of optical elements 301, 302, 303, 304 in the path of the beam 311.

In an embodiment the projection system is configured to at least partly mitigate deformations of the first optical element 301 up to approximately 30, 40 or 50 Hz. In this frequency range the force exerted by actuator 321 and/or external disturbance forces may be the most significant cause of deformations, which may be mitigated using the invention.

In an optional embodiment the control system 305 is configured to receive one or more input signals 351 indicative of a deformation of multiple or each of the plurality of optical elements 301, 302, 303, 304. The control system 305 is configured to determine the one or more output signals 352, 353, 359 based on said input signal 351. By taking into account the deformation of multiple optical elements 301, 302, 303, 304, the accuracy with which the beam 311 is projected onto the object 308 can be increased even further. In the shown example the drive system 306 controls the position of each of the optical elements 301, 302, 303, 304. The input signal 351 may therefore comprise information relating to each of the actuators 321, 322, 323, 324 and relating to the forces each actuator 321, 322, 323, 324 exerts on the respective optical element 301, 302, 303, 304.

In a further embodiment the control system 305 may be configured to generate one or more output signals 352 for controlling a position of each of the plurality of optical elements 301, 302, 303, 304, based on said one or more input signals 351. In this embodiment the accuracy is even further increased by controlling the position of each of the plurality of optical elements 301, 302, 303, 304, while also taking into account the deformation of each of those optical elements 301, 302, 303, 304. In the shown example the drive system 306 controls the position of each of the optical elements 301, 302, 303, 304. The output signal 352 can therefore be used for controlling the position of each of the optical elements 301, 302, 303, 304 with the actuators 321, 322, 323, 324. However, it is also possible that the control system 305 generates one or more additional output signals for controlling the position of one or more of the optical elements 301, 302, 303, 304 separately.

FIG. 3 schematically illustrates that in the shown embodiment the projection system 300 comprises an optional measurement system 371. The measurement system 371 is configured to determine a position of at least the first optical element 301. The measurements obtained by the measurement system 371 may e.g. be used by the control system 305 and/or the drive system 306. Said measurements may e.g. be transmitted as a measurement signal 358. The measurement signal 358 may e.g. be transmitted to the control system 305 as a measurement signal 358a, e.g. via output terminal 371.1 and input terminal 305.4. The measurement signal 358 may e.g. be transmitted to the drive system 306 as a measurement signal 358b, e.g. via output terminal 371.1 and input terminal 306.7. The measurements obtained by the measurement system 371 may e.g. be used to determine the difference between the position of the first optical element 301 and the desired position. Depending on which location of the first optical element 301 is used to determine the position with the measurement system 371, the measurement may be affected by the deformation of the first optical element 301. For example, some locations of the first optical element 301 may be affected a lot by the deformation while others might be less or not at all. Locations that are affected may be on a different position compared to situations wherein the first optical element 301 would not be deformed. If the measurement system 371 measured the position of such location, said measurement may be incorrect if the deformation is not taken into account. The control system 305 may be configured to generate one or more of the output signals 352, 353, 359 based on both of the input signal 351, indicative of the deformation of the first optical element 301 and the measurement signal 358.

The measurement system 371 may e.g. comprise one or more interferometer systems, relative encoders and/or capacitive sensors.

Optionally the measurement system 371 is configured to determine the position of multiple or each of the plurality of optical elements 301, 302, 303, 304. Optionally the projection system comprises multiple measurement systems configured to determine the position of multiple or each of the plurality of optical elements 301, 302, 303, 304. Said measurement systems are optionally arranged on the same frame or on separate frames.

In an embodiment the projection system comprises an optional first frame 361 onto which the plurality of optical elements 301, 302, 303, 304 are arranged, e.g. via actuators 321, 322, 323, 324. The projection system 300 further comprises an optional second frame 362, and the optional measurement system 371 is arranged on the second frame 362. The position of the first optical element 301 is measured relative to the second frame 362. For the sake of clarity, in FIG. 3 the first frame 361, the second frame 362 and the measurement system 371 are only shown with respect to the first actuator 321 and the first optical element 301.

Optionally the first frame 361 and the second frame 362 can be mechanically decoupled for relative movements, e.g. above a certain frequency range, e.g. using a vibration isolation system. As such vibrations to which the first frame 361 and thus the first optical element 301 are exposed, are less or not transmitted to the second frame 362. Since the position of the first optical element 301 is determined relative to the second frame 362, the accuracy of the determined position is improved in this embodiment.

In an optional embodiment the control system 305 further is configured to determine a position of the first optical element 301, e.g. with measurement system 371. The control system 305 is further configured to generate the output signals 352, 353, 359 for controlling the position of at least the second optical element 302 and/or the object support 309 and/or the support structure 312, further based on the position of the first optical element 301. In this embodiment both the deformation and the position of the first optical element 301 are taken into account and can be mitigated, thereby increasing the accuracy of the positioning of the beam 311 even further.

In some embodiments the position of the first optical element 301 may be taken as the reference for positioning the other optical elements 302, 303, 304. That is, the other optical elements 302, 303, 304 are in general positioned relative to the first optical element 301. Due to deformations of the first optical element 301, measurements obtained by the measurement system 371 relating to the position of the first optical element 301 may be incorrect if said deformations are not accounted for. This may result in incorrect positioning of the other optical elements 302, 303, 304 and thus in inaccuracies in the positioning of the beam 311. By taking into account the deformation of the first optical element 301 the invention improves the accuracy in positioning the beam 311.

Figure 4:
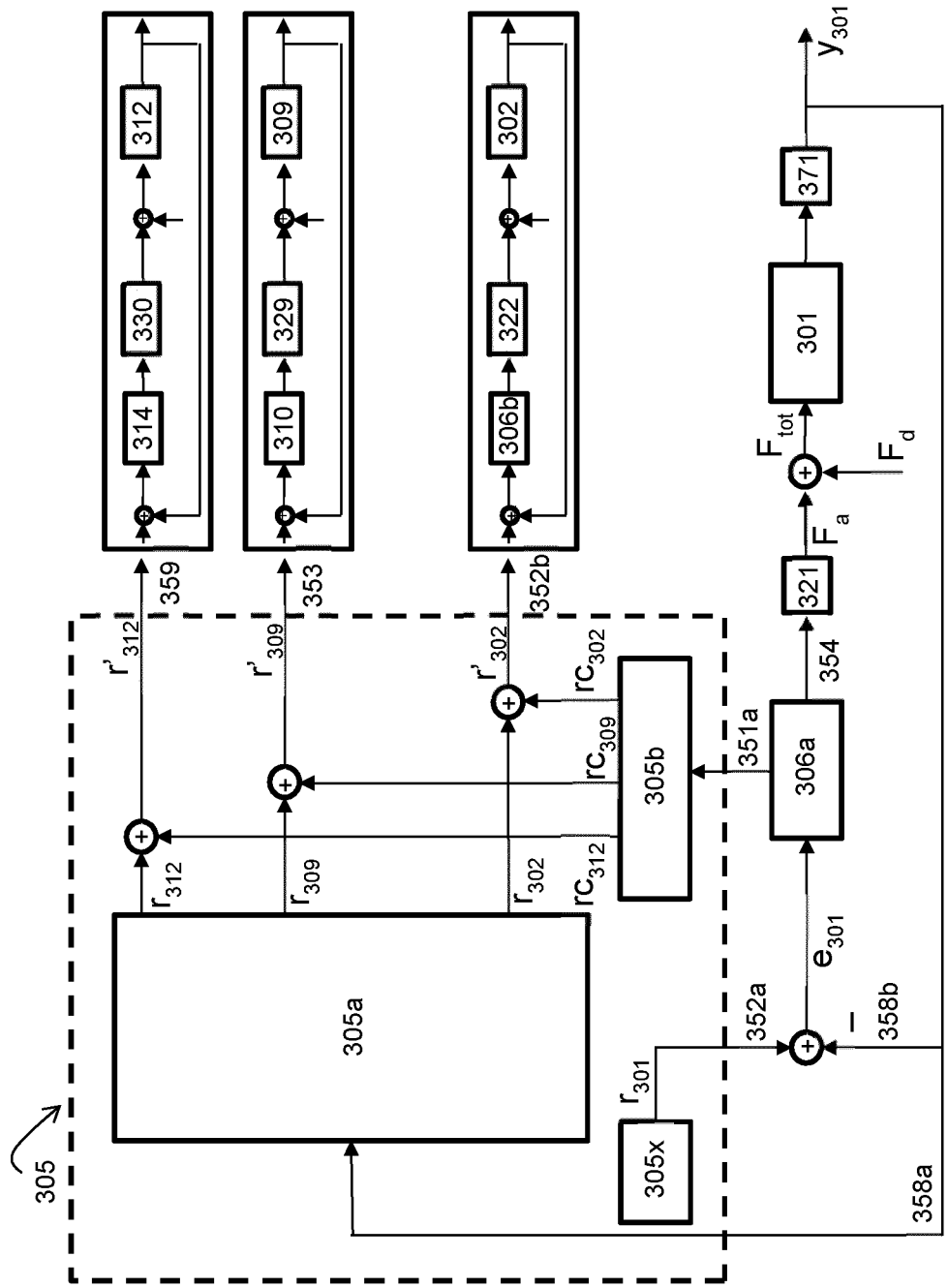
FIG. 4 schematically illustrates an embodiment of the invention.

FIG. 4 schematically illustrates an embodiment of the invention. On the lower end of FIG. 4 an embodiment of a control algorithm for controlling a position of the first optical element 301 is illustrated. A desired position $r_{301}$ is transmitted as an output 352a of the control unit 305 and serves as an input for the control algorithm. A measured position $y_{301}$ at which the first optical element 301 is arranged, is determined, e.g. by measurement system 371. The measured position $y_{301}$ is fed back as measurement signal 358b and subtracted from the desired position $r_{301}$, resulting in a difference $e_{301}$. The difference $e_{301}$ serves as input for a first optical element drive block 306a. The first optical element drive block 306a determines the control signal 354 for the first actuator 321. The first actuator 321 exerts actuator force $F_a$, e.g. for moving the mirror 301 closer to the desired position $r_{301}$. In some embodiments there may be disturbance forces $F_d$, resulting a total force $F_{tot}$ which is exerted on the first optical element 301. The disturbance forces $F_d$ may e.g. originate from external factors, such as a vibrating floor or base frame. The disturbance forces $F_d$ may e.g. originate from another stage in a multiple stage lithographic apparatus. The total force $F_{tot}$ determines the position of the first optical element 301. Measurement system 371 may then for example be used to determine the measured position $y_{301}$ of the first optical element 301, which is fed back as part of measurement signals 358a, 358b.

The shown control algorithm uses actuator force $F_a$ to compensate for the difference $e_{301}$, which may be a result of external influences such as vibrations. The actuator force $F_a$ is based on the actual situation and is not known a priori.

FIG. 4 further illustrates that the desired position $r_{301}$ is e.g. determined by an optional calculation block 305x, which may e.g. use a desired position of the beam on the object as an input. The desired position $r_{301}$ is e.g. dependent on a desired path for the beam. Optionally the measurement signal 358a comprising the measured position $y_{301}$ is used as an input in a position calculation block 305a. The position calculation block 305a is configured to determine, based on said position $y_{301}$, a desired position $r_{302}$, $r_{309}$, $r_{312}$ of one or more of the other optical elements (e.g. optical element 302) and/or the object support 309 and/or the support structure 312. The position $y_{301}$ may represent an undesired deviation in the position of the first optical element 301. A possible inaccuracy in the positioning of the beam as a result of said deviation is at least partly mitigated in this embodiment. Said mitigating is achieved in particular by adapting the position of the other optical elements 302 and/or the object support 309 and/or the support structure 312. It is noted that it is also possible to use the difference $e_{301}$ as an input for position calculation block 305a. It is noted that for simplicity only the second optical element 302 is illustrated in FIG. 4. However, in some embodiments for multiple or even each of the plurality of optical elements a desired position may be calculated based on the difference $e_{301}$. It is also possible that calculations blocks like calculation block 305x are provided for each of the optical elements e.g. for determining a desired position of each optical element based on a desired path of the beam. Optionally position calculation block 305a may then adjust said desired positions based on the measured position $y_{301}$ of the first optical element.

Another possible cause of inaccuracy of the positioning of the beam on the object is a deformation of the first optical element 301. Said deformation is at least partly caused by the actuator force $F_a$. FIG. 4 illustrates that in an embodiment of the invention a control signal from the first optical element drive block 306a, which is representative of the actuator force $F_a$, is used as an input 351a for a deformation compensation block 305b. The deformation compensation block 305b is configured to determine, based on said input 351a, a desired correction $rc_{302}$, $rc_{309}$, $rc_{312}$ of the position of one or more of the other optical elements 302, and/or the object support 309, and/or the support structure 312.

The desired correction $rc_{302}$, $rc_{309}$, $rc_{312}$ at least partly mitigates a possible inaccuracy in the positioning of the beam as a result of said deformation of the first optical element 301. Said mitigating is achieved by controlling the position of the other optical elements 302 and/or the object support 309 and/or the support structure 312. The deformation of the first optical element 301 may also result in an error in the measured position $y_{301}$ of the first optical element 301. Since the measured position $y_{301}$ is used as input for the position calculation block 305a, an error may then occur in the determination of the desired positions $r_{302}$, $r_{309}$, $r_{312}$ by the position calculation block 305a. Also this error can be at least partly mitigated with the desired correction $rc_{302}$, $rc_{309}$, $rc_{312}$.

The desired correction $rc_{302}$, $rc_{309}$, $rc_{312}$ is then added to the desired position $r_{302}$, $r_{309}$, $r_{312}$ of the respective optical element 302 and/or object support 309 and/or the support structure 312. This results in a corrected desired position $r'_{302}$, $r'_{309}$, $r'_{312}$. The corrected desired position $r'_{302}$ is transmitted as an output 352b which is used as an input for a control algorithm for controlling a position of the second optical element 302, e.g. with the second actuator 322. In particular, the input 352b may be received by a second optical element drive block 306b which determines the control signal 357 for the second actuator 322. The corrected desired position $r'_{309}$ forms output signal 353 which is used as an input for a control algorithm for controlling a position of the object support 309, e.g. with the object support actuator 329. The corrected desired position $r'_{312}$ forms output signal 359 which is used as an input for a control algorithm for controlling a position of the support structure 312, e.g. with the support structure actuator 330.

FIG. 4 shows the control algorithms of the other optical elements 302 simplified for the sake of clarity. However, these may in an embodiment be similar to the first optical element 301. That is, disturbance forces may affect the positioning of the other optical elements 302, and/or optionally the deformation of the other elements 302 may also be mitigated. For example, forces exerted on the other optical elements 302 may be used as input for the deformation compensation block 305b, e.g. in addition to or as alternative for input 351a. Optionally, also a desired correction for the first optical element 301 can be determined, e.g. in addition to or as alternative for one or more of the desired correction $rc_{302}$, $rc_{309}$, $rc_{312}$. It is further noted that in some embodiments a desired correction $rc_{302}$, $rc_{309}$, $rc_{312}$ may be determined only for one or more of the optical elements 302, or only for the object support 309 and/or the support structure 312.

The deformation compensation block 305b may e.g. utilize a correction matrix. The correction matrix results, based on the input 351a which represents the actuator force $F_a$, in the desired corrections $rc_{302}$, $rc_{309}$, $rc_{312}$. Said correction matrix may comprise constant values. Alternatively or in combination it may be comprise values dependent on the frequency. Alternatively or in combination, more complex algorithms could be used to determine corrections for the other optical elements 302 and/or object support 309 and/or support structure 312. Values and/or algorithms in the correction matrix may be determined with models, e.g. applying finite elements, and may e.g. be validated or fine-tuned with empirical experiments or during use.

In FIG. 4, first the desired position $r_{302}$, $r_{309}$, $r_{312}$ is determined based on the measured position $y_{301}$. However, it is also possible to use both the measured position $y_{301}$ and the actuator force 351a as input for directly determining the corrected desired position $r'_{302}$, $r'_{309}$, $r'_{312}$. This may e.g. be done utilizing a matrix which at least implicitly includes the correction matrix. This may advantageously limit the calculations and computational resources required for determining the corrected desired position $r'_{302}$, $r'_{309}$, $r'_{312}$, e.g. because the number of required non-linear calculations can be reduced.

In an embodiment the desired position $r_{301}$ of the first optical element 301 may be constant during use, e.g. during a lithographic process, e.g. during exposure of a substrate. In this embodiment the path of the beam may be kept relatively constant and the object support 309 can be moved to change the position of the object on which the beam is positioned.

It is noted that optionally the calculation block, and/or the position calculation block 305a, and/or the deformation compensation block 305b, may be comprised by the control system 305 shown in FIG. 3. The first optical element drive block 306a and the second optical element drive block 306b shown in FIG. 4 may be part of the drive system 306 shown in FIG. 3. The input 351a shown in FIG. 4 may be comprised by the input signal 351 shown in FIG. 3. The output 352a and the output 352b shown in FIG. 4 may be comprised by the output signal 352 shown in FIG. 3. The measurement signals 358a and 358b shown in FIG. 4 may be comprised by the measurement signal 358 shown in FIG. 3.

In an embodiment, the deformation compensation block 305b may be configured to determine a desired correction of the first optical element 301, which may e.g. be used to correct the desired position $r_{301}$ of the first optical element. It is also possible for the deformation compensation block 305b to determine the deformation of the first optical element 301, and/or the error made in positioning and/or measuring the position $y_{301}$ of the first optical element 301 due to the deformation. This may then be used to adjust the position of the first optical element 301, and/or to adjust the desired position $r_{301}$ and/or measured position $y_{301}$. The embodiments described in this paragraph may be used in combination or as an alternative to adjusting the position of the other optical elements 302, and/or the object support 309, and/or the support structure 312. For example, it may in some embodiments be sufficient to only control the position of the first optical element 301 based on the input signal 351a, e.g. to mitigate the deformation of the first optical element.

The invention further relates to a lithographic apparatus. An embodiment of such lithographic apparatus is shown in FIG. 1 and FIG. 2. The lithographic apparatus according to the invention comprises a substrate support WT configured to hold a substrate W and a radiation source configured to generate a beam. The lithographic apparatus further comprises a projection system PS according to the invention, e.g. according to one or more of the embodiments illustrated herein. In this embodiment the object on which the beam is projected in the projection system according to the invention corresponds with the substrate W. The pattern can be projected more accurately onto the substrate with the lithographic apparatus according to the invention.

In a further embodiment the lithographic apparatus comprises a further substrate support configured to hold a further substrate. The lithographic apparatus is configured to carry out steps on the further substrate in preparation of a subsequent exposure of the further substrate, while a pattern is being exposed on the substrate W on the substrate support WT. For example, the lithographic apparatus may be a "multiple stage" machine as explained above. The invention may in particular be advantageous when applied in a lithographic apparatus according to this embodiment, because the steps carried out on the further substrate may cause vibrations on the projection system PS. Since these vibrations may affect the position of the first optical element and the other optical elements, said position of the first optical element may e.g. be adjusted to compensate for said vibrations. To adjust said position of the first optical element, forces may be exerted onto said first optical element, e.g. with an actuator, resulting in deformations of said first optical element. In the projection system according to the invention these deformation can be mitigated, thereby increasing the accuracy with which the pattern is projected onto the substrate.

In an embodiment the lithographic apparatus according to the invention further comprises a support structure (e.g. a mask table) MT constructed to support patterning device (e.g. a mask or a reticle) MA configured to impart a pattern to the beam. The control system of the projection system may be configured to generate an output signal for controlling a position of said support structure MT, based on the input signal. In this embodiment the deformation of the first optical element may be at least partly compensated by controlling the position of the support structure MT, e.g. with the first positioner PM.

In an embodiment the object support drive system 310 shown in FIG. 3 and FIG. 4 may correspond, comprise or be part of the second positioner PW shown in FIG. 1. In an embodiment the support structure drive system 314, shown in FIG. 3 and FIG. 4 may correspond, comprise or be part of the first positioner PM shown in FIG. 1

The invention further relates to methods for controlling a projection system which will be elaborated on below with reference to FIG. 3. The methods can be performed with the projection system and/or lithographic apparatus according to the invention, however the methods are not limited thereto. Any of the features explained with reference to the projection system and/or lithographic apparatus according to the invention may be added to one or more of the methods according to the invention.

In an embodiment the invention relates to a method for controlling a projection system 300 comprising a plurality of optical elements 301, 302, 303, 304 configured to direct a beam 311 along a path. The method comprises the step of determining an input signal 351 indicative of a deformation of at least a first optical element 301 of the plurality of optical elements 301, 302, 303, 304. The method comprises the step of controlling a position of at least a second optical element 302 of the plurality of optical elements 301, 302, 303, 304, based on said input signal 351.

In an embodiment the invention relates to a method for controlling a projection system 300 comprising a plurality of optical elements 301, 302, 303, 304 configured to direct a beam 311 along a path onto an object 308. The method comprises the step of determining an input signal 351 indicative of a deformation of at least a first optical element 301 of the plurality of optical elements 301, 302, 303, 304. The method comprises the step of controlling a position of the object 308, based on said input signal 351.

In an embodiment the invention relates to a method for controlling a projection system 300 comprising a plurality of optical elements 301, 302, 303, 304 configured to direct a beam 311 along a path onto an object 308, wherein a pattern is imparted to the beam 311 by a patterning device 313. The method comprises the step of determining an input signal 351 indicative of a deformation of at least a first optical element 301 of the plurality of optical elements 301, 302, 303, 304. The method comprises the step of controlling a position of the patterning device 313, based on said input signal 351.

In an embodiment, the beam comprises deep ultraviolet radiation, also commonly referred to as DUV and/or the optical elements are lenses.

While specific embodiments of the invention have been described above, it will be appreciated that the invention may be practiced otherwise than as described. The behavior of the apparatus may be defined in large part by a computer program containing one or more sequences of machine-readable instructions for implementing certain steps of a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A projection system for a lithographic apparatus, comprising:
    a plurality of optical elements configured to direct a beam along a path;
    a control system configured to:
        receive an input signal indicative of a deformation of at least a first optical element of the plurality of optical elements, and
        generate an output signal configured to control a position of at least a second optical element of the plurality of optical elements, based on the input signal, and
    a drive system configured to control a position of the first optical element, and wherein the input signal represents forces controlled by the drive system to be exerted on the first optical element.

2. The projection system of claim 1, wherein the control system is configured to generate one or more output signals for controlling a position of multiple of the plurality of optical elements other than the first optical element, based on the input signal.

3. The projection system of claim 1, wherein the control system is configured to generate one or more output signals for controlling a position of each of the plurality of optical elements other than the first optical element, based on the input signal.

4. The projection system of claim 1, wherein the plurality of optical elements are configured to position the beam onto an object that is arranged on an object support, and wherein the control system is further configured to generate an output signal for controlling a position of the object support, based on the input signal.

5. A projection system for a lithographic apparatus, comprising:
    a plurality of optical elements configured to direct a beam along a path, wherein the plurality of optical elements is configured to position the beam onto an object that is arranged on an object support,
    a control system configured to:
        receive an input signal indicative of a deformation of at least a first optical element of the plurality of optical elements, and
        generate an output signal for controlling a position of the object support, based on the input signal, and
    a drive system configured to control a position of the first optical element, and wherein the input signal represents forces controlled by the drive system to be exerted on the first optical element.

6. The projection system of claim 1, wherein the beam is configured to, before the plurality of optical elements receive the beam, have a pattern imparted by a patterning device supported by a support structure, wherein the control system is further configured to generate an output signal for controlling a position of the support structure, based on the input signal.

7. A projection system for a lithographic apparatus, comprising:
    a plurality of optical elements configured to direct a beam along a path, wherein the beam is configured to, before the plurality of optical elements receive the beam, have a pattern imparted by a patterning device supported by a support structure,
    a control system configured to:
        receive an input signal indicative of a deformation of at least a first optical element of the plurality of optical elements, and
        generate an output signal for controlling a position of the support structure, based on the input signal, and
    a drive system configured to control a position of the first optical element, and wherein the input signal represents forces controlled by the drive system to be exerted on the first optical element.

8. The projection system of claim 1, wherein the first optical element is the optical element that is arranged last of the plurality of optical elements in the path of the beam.

9. The projection system of claim 8, wherein the drive system is configured to control the forces exerted on the first optical element to at least partially compensate for a difference between a position of the first optical element and a desired position.

10. The projection system of claim 1, further comprising:
    a first frame onto which the plurality of optical elements are arranged;
    a second frame; and
    a measurement system arranged on the second frame and configured to determine a position of at least the first optical element.

11. The projection system of claim 1, wherein the control system is configured to receive one or more input signals indicative of a deformation of each of the plurality of optical elements, and wherein the control system is configured to determine the output signal based on the input signals.

12. The projection system of claim 11, wherein the control system is configured to generate one or more output signals for controlling a position of each of the plurality of optical elements, based on the one or more input signals.

13. The projection system of claim 1, wherein the control system is further configured to:
    determine a position of the first optical element; and
    generate the output signals and/or one or more additional output signals for controlling the position of at least the second optical element and/or the object support and/or the support structure, further based on the position of the first optical element.

14. The projection system of claim 1, wherein the optical element is a mirror.

15. The projection system of claim 1, wherein the beam comprises extreme ultra violet light radiation.

16. The projection system of claim 4, wherein the object is a substrate.

17. A lithographic apparatus comprising:
    a substrate support configured to hold a substrate;
    a radiation source configured to generate a beam;
    a support structure configured to support a patterning device configured to impart a pattern to the beam; and a projection system, comprising:
- a plurality of optical elements configured to direct a beam along a path,
- a control system configured to:
  - receive an input signal indicative of a deformation of at least a first optical element of the plurality of optical elements, and
  - generate an output signal for controlling a position of at least a second optical element of the plurality of optical elements, based on the input signal, and
- a drive system configured to control a position of the first optical element, and wherein the input signal represents forces controlled by the drive system to be exerted on the first optical element, and configured to position the beam onto the substrate.

18. The lithographic apparatus of claim 17, comprising a further substrate support configured to hold a further substrate, wherein the lithographic apparatus is configured to carry out steps on the further substrate in preparation of a subsequent exposure of the further substrate while a pattern is being exposed on the substrate on the substrate support.

19. A method for controlling a projection system comprising a plurality of optical elements configured to direct a beam along a path, the method comprising:
- determining an input signal indicative of a deformation of at least a first optical element of the plurality of optical elements; and
- controlling a position of at least a second optical element of the plurality of optical elements, based on the input signal,
- wherein the input signal represents forces controlled by a drive system to be exerted on the first optical element.

* * * * *